(12) United States Patent
Klingemann et al.

(10) Patent No.: US 6,867,856 B1
(45) Date of Patent: Mar. 15, 2005

(54) APPARATUS FOR READING MARKS ON A SEMICONDUCTOR SUBSTRATE

(75) Inventors: Raymond E. Klingemann, Buda, TX (US); Michael McCarthy, Red Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 720 days.

(21) Appl. No.: 09/909,299

(22) Filed: Jul. 19, 2001

(51) Int. Cl.[7] ............................................. G01N 21/01
(52) U.S. Cl. ...................................................... 356/244
(58) Field of Search ......................... 356/446, 399–401, 356/244; 257/E23.179, E23.279

(56) References Cited

U.S. PATENT DOCUMENTS

| | | | | |
|---|---|---|---|---|
| 3,801,182 A | * | 4/1974 | Jones | ........................ 356/369 |
| 4,510,673 A | | 4/1985 | Shils et al. | |
| 5,231,536 A | * | 7/1993 | Wilt et al. | ................... 356/401 |
| 5,553,168 A | | 9/1996 | Hennessey et al. | |
| 5,777,743 A | | 7/1998 | Bacchi et al. | |
| 5,861,910 A | * | 1/1999 | McGarry et al. | ........... 382/145 |
| 5,894,348 A | | 4/1999 | Bacchi et al. | |
| 5,894,530 A | | 4/1999 | Wilt | |
| 5,933,521 A | | 8/1999 | Pasic | |
| 5,975,836 A | * | 11/1999 | Rodriguez | .................. 414/787 |

* cited by examiner

*Primary Examiner*—Richard A. Rosenberger
(74) *Attorney, Agent, or Firm*—Paul Drake; Rennie Wm. Dover

(57) ABSTRACT

An apparatus and a method for reading a mark on a wafer. The apparatus includes a wafer receptacle having a mirror material coated on one side and a plurality of slots formed therein. The wafer receptacle is coupled to a base plate via a back support. The apparatus may also include a front support coupled between the wafer receptacle and the base plate. A plurality of concave mirrors are coupled to the base plate. A wafer placed in one of the plurality of slots reflects light to the mirror material coating the wafer receptacle. The light is reflected by the mirror material to one of the concave mirrors, which rectifies an image contained in the light and reflects the rectified image to the back support. The image can be viewed on the back support.

20 Claims, 2 Drawing Sheets

APPARATUS FOR READING MARKS ON A SEMICONDUCTOR SUBSTRATE

FIELD OF THE INVENTION

This invention relates, in general, to semiconductor manufacturing and, more particularly, to apparatuses and methods for reading marks on semiconductor substrates.

BACKGROUND OF THE INVENTION

Integrated circuits and discrete semiconductor devices are typically fabricated on wafers made from semiconductor substrates such as, for example, silicon, silicon germanium, gallium arsenide, indium phosphide, and the like. The semiconductor wafers have either a positioning notch or a flat edge for aligning the wafers and scribe marks for individual wafer identification. Scribe marks are small alphanumeric sequences formed on the wafer by chemical etching, laser cutting, or other techniques capable of making a well defined mark on a semiconductor wafer. These marks are located close to the positioning notch or the flat edge of the semiconductor wafer. Because scribe marks are used for identifying individual semiconductor wafers, it is very important for semiconductor device manufacturers to be able to read the scribe marks.

One technique for reading scribe marks is described in U.S. Pat. No. 5,933,521 and involves moving a cassette passed a fixed reading position of a single stationary camera. Another technique for reading scribe marks is described in U.S. Pat. No. 5,553,168 and involves using a camera to capture a scribe mark image which is then converted from a video signal to a digital signal by a converter. A computer is then used to interpret the digital signal. These scribe readers have a large number of moving parts, use very sophisticated circuitry, and are expensive to maintain and operate.

Accordingly, what is needed is an apparatus for reading marks on substrates that is inexpensive to manufacture and a method for reading the marks that can be easily integrated into a semiconductor manufacturing operation.

SUMMARY OF THE INVENTION

The present invention satisfies the foregoing need by providing an apparatus and a method for reading marks on objects such as, for example, a semiconductor wafer. In a preferred embodiment of an apparatus for reading marks incorporating features of the present invention, a wafer receptacle having a slot formed therein is coated on at least one side with a mirror material. The wafer receptacle is spaced apart from a base plate in a beveled or angled fashion. A back support is coupled between the wafer receptacle and the base plate. Optionally, a concave mirror may be coupled to the base plate. When the concave mirror is coupled to the base plate, the back support serves as a wafer reading side. Moreover, light sources may be coupled to the apparatus to increase the amount of light available to carry the images.

In another aspect, the present invention includes a method for reading a mark on an object such as, for example, a semiconductor wafer. When the object is inserted into a slot in the receptacle, light is reflected from the object to the mirror material coating the receptacle. The mirror material reflects the light to a wafer reading area or, when present, to the concave mirror. The concave mirror then reflects the light to the wafer reading area.

BRIEF DESCRIPTION OF THE DRAWING

The present invention will be better understood from a reading of the following detailed description, taken in conjunction with the accompanying drawing figures in which like references designate like elements and in which.

DETAILED DESCRIPTION

Figure 1:
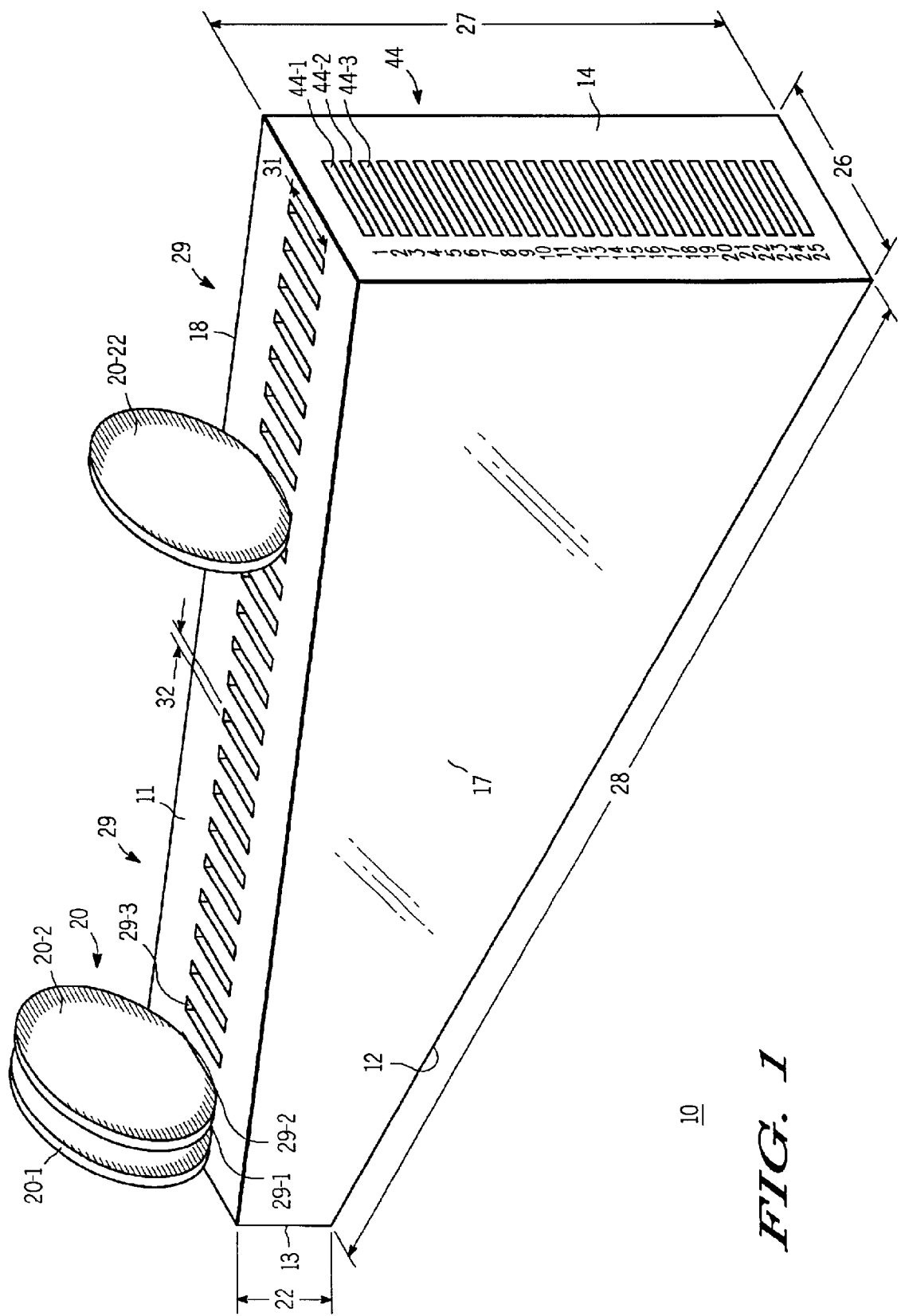
FIG. 1 is an isometric view of an apparatus for reading marks on an object in accordance with an embodiment of the present invention.

FIG. 1 is an isometric view of an apparatus 10 for reading marks on an object in accordance with an embodiment of the present invention. When used for reading scribe marks on a semiconductor wafer, apparatus 10 is referred to as a scribe reader. In accordance with a first embodiment, scribe reader 10 comprises a wafer receptacle or top plate 11 spaced apart from a bottom or base plate 12, a front support 13 spaced apart from and substantially parallel to a back support 14, and a vertical support 17 spaced apart from and substantially parallel to an opposing vertical support 18. Wafer receptacle 11 is also referred to as a wafer support side, and back support 14 is also referred to as a scribe mark reader side, a mark reading side, or a wafer reading area. By way of example, wafer receptacle 11, base plate 12, front support 13, and back support 14 are each rectangularly shaped sections that are coupled together to form the body of scribe reader 10. Wafer receptacle 11 and base plate 12 have front, back, right, and left sides. Front support 13 and back support 14 have lower, upper, right, and left sides. It should be understood that the use of the terms front, back, right, and left are merely used for descriptive purposes and are not a limitation of the present invention. For example, the right side of front support 13 and the left side of back support 14 are coupled by vertical support 17. The lower side of front support 13 is attached to the front side of bottom plate 12 and the lower side of back plate 14 is attached to the back side of bottom plate 12. Front support 13 and back support 14 are attached to bottom plate 12 such that front and back supports 13 and 14, respectively, are substantially perpendicular to bottom plate 12 and parallel to each other. The upper side of front support 13 is attached to the front side of wafer receptacle 11 and the upper side of back support 14 is attached to the back side of wafer receptacle 11. Thus, wafer support 14 is vertically oriented.

Front support 13 and back support 14 have a lateral dimension indicated by arrows 16. Front support 13 has a vertical dimension indicated by arrows 22 and back support 14 has a vertical dimension indicated by arrows 27. Lateral dimension 26 of front and back supports 13 and 14, respectively, are preferably the same; however, vertical dimension 27 of back support 14 is greater than vertical dimension 22 of front support 13. In other words, back support 14 is taller than front support 13. Thus, wafer receptacle 11 is angled or beveled with respect to:

bottom plate 12. By way of example, lateral dimension 26 is 11.5 centimeters (cm), vertical dimension 22 is 5 cm, vertical dimension 27 is 28 cm, and lateral dimension 28 is 20 cm. The dimensions are selected such that the angle formed between wafer receptacle 11 and back support 14 is forty-five degrees.

Preferably, wafer receptacle 11, base plate 12, front support 13, and back support 14 are sheets of a plastic material such as, for example, Plexiglas, which are glued together to form the body of scribe reader 10. The method of attaching wafer receptacle 11, plate 12, and supports 13 and 14 together is not a limitation of the present invention. For example, the plates and supports can be screwed together, nailed together, taped together, frictionally fit together, or the like.

Scribe reader 10 further includes a right vertical support 17 and a left vertical support 18, which are quadrilateral structures where each has an upper side, a lower side, a front side, and a back side. The lower side of vertical support 17 is attached to the right side of bottom plate 12 and the upper side of vertical support 17 is attached to the right side of wafer receptacle 11. The front side of vertical support 17 is attached to the right side of front support 13 and the back side of vertical support 17 is attached to the left side of back support 14. The lower side of vertical support 18 is attached to the left side of bottom plate 12 and the upper side of vertical support 17 is attached to the left side of wafer receptacle 11. The front side of vertical support 18 is attached to the left side of front support 13 and the back side of vertical support 18 is attached to the right side of back support 14. It should be understood that front support 13 and vertical supports 17 and 18, individually or collectively, are optional. An advantage of including front support 13 and vertical supports 17 and 18 is that they provide additional structural support to scribe reader 10. Further, the shape of vertical supports 17 and 18 is not a limitation of the present invention. For example, they can be rectangular, circular, oval, polygonal, or any other geometric shape.

A plurality of slots 29 are formed in wafer receptacle 11, wherein each slot 29 has a length denoted by arrows 31 and a width denoted by arrows 32. Preferably, slots 29 have a length that is less than the diameter of a wafer 20 and a width that is at least five percent-greater than the width of wafer 20. By way of example, slots 29 have a length 31 of 7.7 cm and a width of 0.1 cm. Further, each slot 29 is spaced apart from an adjacent slot by a distance that is at least twice the width of wafer 20, e.g., for a wafer having a width of 0.1 cm, adjacent slots are spaced apart by 0.7 cm. In the embodiment shown in FIG. 1, wafer receptacle 11 has twenty-five slots, wherein the lateral distance between adjacent slots is 0.7 cm. It should be noted that the number of slots and the distance between the slots is not a limitation of the present invention. In this embodiment, the number of slots was selected to match the number of wafers held in a standard cassette used in the processing of semiconductor wafers. However, there may be more or fewer than twenty-five slots.

Figure 2:
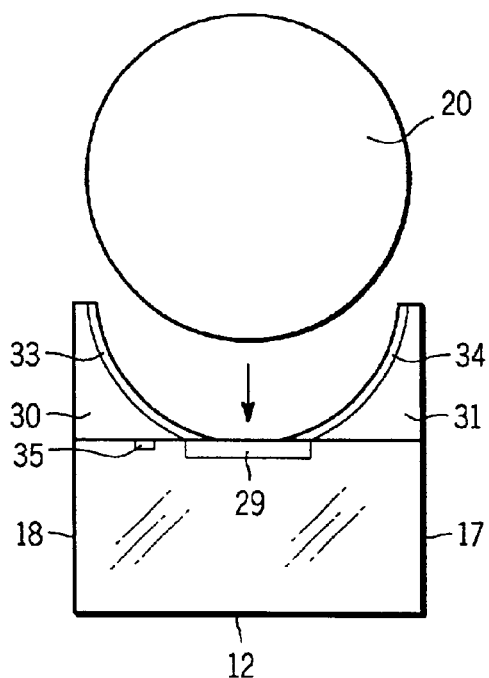
FIG. 2 is a front view of a portion of the apparatus of FIG. 1 further illustrating slotted guides.

Briefly referring to FIG. 2, a front view of a portion of scribe reader 10 is shown having slotted guides 30 and 31 mounted to wafer receptacle 11. Slotted guide 30 is adjacent a first end of slot 29 and slotted guide 31 is adjacent a second end of slot 29. By way of example, slotted guides 30 and 31 have ends that extend upward from wafer receptacle 11 by 1 cm. Slotted guides 30 and 31 also have slots 33 and 34, respectively, each of which has a width of 0.3 cm. Slotted guides 30 and 31 prevent wafers 20 from falling too far forward or backward while in slots 29. A suitable material for slotted guides 30 and 31 is Plexiglas; however, it should be understood the type of material for slotted guides 30 and 31 is not a limitation of the present invention. It should be further understood that a set of slotted guides 30 and 31 may be associated with each wafer slot 29 or with a subset of the set of wafer slots 29. For example, only slots 29-24 and 29-25 may have slotted guides associated with them. Although slotted guides are described as being formed from two pieces, this is not a limitation of the present invention. For example, the slotted guide may be a one-piece or unitary slotted guide or be made from more than two pieces.

An underside of wafer receptacle 11 is coated with a mirror material, which is further described with reference to FIG. 3.

FIG. 1 further illustrates the presence of a series of gradations 44 in back support 14. Gradations 44 are sequentially numbered with the numbers 1–25. This corresponds to the number of slots 29 in wafer receptacle 11. It should be understood that the number of gradations is not a limitation of the present invention and that showing twenty-five gradations is merely for exemplary purposes. When slots 29 are populated with wafers 20, an image of the scribe marks is reflected to a corresponding gradation of the plurality of gradations 44, i.e., the scribe mark for wafer 20-1 in slot 29-1 is reflected to the first gradation 44-1 of the plurality of gradations, the scribe mark for wafer 20-2 in slot 29-2 is reflected to the second gradation 44-2 of the plurality of gradations, etc. It should be understood that the wafers are collectively identified by reference number 20, the slots are collectively identified by the reference number 29, and the gradations are collectively identified by the reference number 44, and that individual wafers, mirrors, and gradations are identified by the reference number having an individual identifier appended thereto. For example, wafer 20-1 refers to the wafer in the first slot 29-1.

Although native or ambient light is sufficient for the operation of scribe reader 10, a plurality of light sources or light emitting devices 35 may be coupled to scribe reader 10. In FIG. 2 only a single light source is shown for the sake of clarity, however, it is preferable to have a light source 35 associated with each wafer slot 29. Also for the sake of clarity, light sources 35 have been omitted from FIGS. 1 and 3, but have been included in FIG. 2. Light emitting devices 35 provide additional light for reflecting images to and from the mirror material disposed on the underside of wafer receptacle 11. It should be understood that the use of light emitting devices is optional and, if used, the type of light emitting device can include, but is not limited to a diffuse light source, a laser, a light emitting diode, an incandescent light, fluorescent light, etc. Ambient or native light refers to light inherently surrounding scribe reader 10. Any light source may be used, however it may be preferable to avoid using a light source that is capable of altering any photoresist that may be present.

A plurality of mirrors 39 (shown in FIG. 3) are coupled to bottom plate 12 wherein the each mirror is associated with a corresponding slot and a corresponding gradation. For example, a first mirror corresponds to slot 29-1 and gradation 44-1, a second mirror corresponds to slot 29-2 and gradation 44-2, a third mirror corresponds to slot 29-3 and gradation 44-3, etc. The mirrors are collectively identified by reference number 39 and are further described with reference to FIG. 3.

Figure 3:
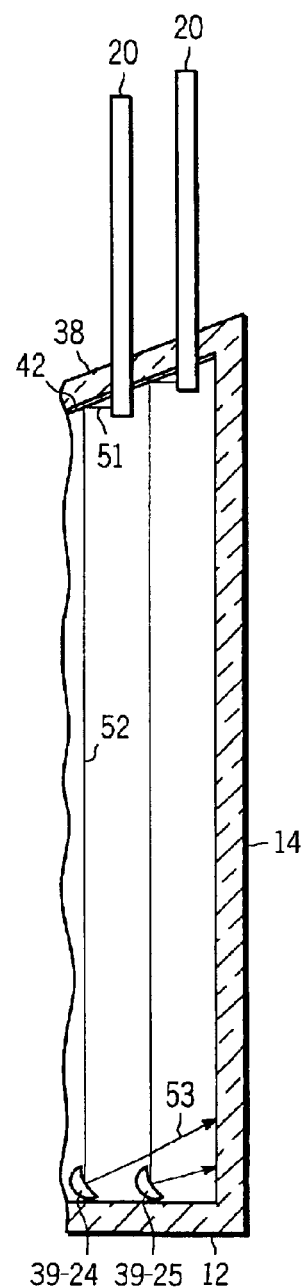
FIG. 3 is a cross-sectional side view of the apparatus of FIG. 1.

Now referring to FIG. 3, a cross-sectional side view of a portion of scribe reader 10 is shown. More particularly, wafers 20, slots 29, mirror material 38, and mirrors 39 are shown. Mirror material 38 is coated on bottom surface 42 of wafer receptacle 11. Suitable material for mirror material 38 includes for example glass or Plexiglas coated with silver. Techniques for applying a mirror material to a surface are known to those skilled in the art.

A plurality of concave mirrors 39 are mounted to bottom plate 12. As described hereinbefore, preferably, there is one concave mirror associated with each slot 29 in wafer receptacle 11 and each gradation on back support 14. Each concave mirror 39 is positioned to receive light reflected from mirror material 38 adjacent the corresponding slot. Thus, the first concave mirror receives light reflected from mirror material 38 adjacent slot 29-1, the second concave mirror receives light reflected from mirror material 38 that is between slot 29-1 and slot 29-2, i.e., adjacent slot 29-2, the third concave mirror receives light reflected from mirror material 38 that is between slot 29-2 and slot 29-3, i.e., adjacent slot 29-3, etc. Concave mirrors 39-24 and 39-25 are shown in FIG. 3. Concave mirror 39-24 receives light reflected from mirror material 38 that is between slot 29-23 and slot 29-24, i.e., adjacent slot 29-24 and concave mirror 39-25 receives light reflected from mirror material 38 that is between slot 29-24 and slot 29-25. It should be noted that each concave mirror 39 is laterally spaced apart from its associated slot 29. Concave mirrors 39 reflect the light received from the mirror material 38 towards a corresponding gradation 44 on back support 14, enabling a person or a camera to read the scribe marks.

Still referring to FIG. 3, light from each wafer is reflected to corresponding portions of the mirror material coating wafer receptacle 11. The light is reflected from mirror material 38 towards a corresponding mirror 39 which, in turn, directs the reflected light to the correct gradation 44. To determine the dimensions of scribe reader 10 and the characteristics of mirrors 39 to create an image on back support 14, the following equations are used:

$$\frac{1}{S_n} + \frac{1}{P_n} = \frac{2}{R_n} \qquad \text{Eqt. 1}$$

and $$M_n = \frac{-P_n}{S_n} \qquad \text{Eqt. 2}$$

where $S_n$=distance between the object and the concave mirror;
$P_n$=position of the image;
$R_n$=radius of curvature of the concave mirror;
$M_n$=magnification of the image reflected from the concave mirror; and
n is an integer greater than or equal to 1.

The distance, $S_n$, between the object and the concave mirror 39 is a design choice. Because there are "n" concave mirrors, there will be "n" values for $S_n$. By way of example, the distance between the portion of the mirror material 38 that reflects light to a first concave mirror 39-1 and the focal point of the first concave mirror 39-1 is selected to be 8 cm, and the lateral distance between adjacent slots 29 is selected to be 0.7 cm. The distance between mirror material 38 and the focal point of each corresponding concave mirror 39 is determined from the following equation:

$$S_n = 0.7*(n-1) + S_1 \qquad \text{Eqt. 3}$$

Thus, the distance between the portion of the mirror material 38 that reflects light to the second concave mirror 39-2 and the focal point of the second concave mirror 39-2, i.e., $S_2$, is calculated to be 8.7 cm, the distance between the portion of the mirror material 38 that reflects light to the third concave mirror 39-3 and the focal point of the third concave mirror 39-3, i.e., $S_3$, is calculated to be 9.4 cm, the distance between the portion of the mirror material 38 that reflects light to the fourth concave mirror 39-4 and the focal point of the fourth concave mirror 39-4, i.e., $S_4$, is calculated to be 10.1 cm, etc.

Combining equations 2 and 3 to solve for the magnification yields:

$$M_n = \frac{-P_n}{S_n} = \frac{R_n}{2S_n - R_n} \qquad \text{Eqt. 4}$$

Rearranging equation 4 and solving for the radius of curvature of the concave mirror yields:

$$R_n = \frac{2M_n S_n}{M_n - 1} \qquad \text{Eqt. 5}$$

The value of the magnification, $M_n$, is selected as a design choice. It is desirable to have a magnification of at least −2. It should be understood that a magnification having a value of less than zero means the image will be real. It should be further understood that to achieve a constant magnification, each mirror has a different radius of curvature. Thus, using a magnification value of −2, i.e., a value for $M_n$ of −2, the equation for the radius of curvature becomes:

$$R_n = \frac{4S_n}{3} \qquad \text{Eqt. 6}$$

So, the radius of curvature, $R_1$, for the first concave mirror 39-1 is 10.66 cm and the radius of curvature, $R_2$, for the second concave mirror 39-2 is 11.60 cm. The radii of curvature increase for each successive concave mirror. The radius of curvature, $R_{25}$, of the twenty-fifth concave mirror 39-25 is 55.73 cm.

In operation, wafers 20 are placed in scribe reader 10 such that the alignment notches, or the wafer flats are in a predetermined position. Preferably, they are positioned to be facing bottom plate 12. Light reflected from a scribe mark impinges on the portion of the wafer material 38 disposed on wafer receptacle 11 (illustrated by arrows 51) and is reflected towards concave mirrors 39 (indicated by arrows 52). Concave mirrors 39 rectify and reflect the image towards their respective gradations on back support 14 (illustrated by arrows 53). The image from slot 29-1 appears at gradation 44-1 which is marked by the number 1, the image from slot 29-2 appears at gradation 44-2 which is marked by the number 2, the image slot 29-3 appears at the gradation 44-3 which is marked the number 3, etc. An operator then reads the scribe marks at back support 14. In the event more light is needed, an additional light source can be provided as discussed hereinbefore.

By now it should be appreciated that a method and apparatus have been provided for reading scribe marks on a wafer. An advantage of the present invention is that the scribe reader has no moving parts, hence it is cost efficient to manufacture and easily integrable into a manufacturing environment. Further, the apparatus of the present invention is not limited in the number of wafers that can be held. For example, the scribe reader can be designed to accept any number of wafers, e.g., a single wafer, two wafers, fifty wafers or more. Moreover, the present invention provides an easy, reliable, and accurate method for reading scribe marks on wafers. Another advantage is that all the wafers can be viewed simultaneously, thereby allowing direct comparisons between the marks on the wafers. Yet another advantage of the present invention is that it is a unitary apparatus having no movable parts. This not only simplifies the use of the apparatus, but also decreases the cost of maintaining it, along with increasing the longevity of the apparatus.

Although certain preferred embodiments and methods have been disclosed herein, it will be apparent from the foregoing disclosure to those skilled in the art that variations and modifications of such embodiments and methods may be made without departing from the spirit and scope of the invention. For example, rather than having an angled side, the wafer receptacle could be manufactured such that the slots have different lengths, allowing different distances of the wafers to reside within the scribe reader. Or, the concave mirrors can be replaced with one or more cameras. It is intended that the invention shall be limited only to the extent required by the appended claims and the rules and principles of applicable law.

What is claimed is:

1. An apparatus for reading a mark on a wafer, comprising:
    a support structure and comprising:
    a back support having an upper side, a lower side, a first vertical support side, and a mark reading area, wherein the mark reading area has at least one gradation;
    a vertical support having first, second, and third sides, the first side coupled to the first vertical support side of the back support; and
    a wafer support having a first side coupled to the upper side of the back support and a second side coupled to the second side of the vertical support, the wafer support having first and second major surfaces and at least one slot extending into the wafer support from the first major surface, the at least one slot for receiving said wafer such that a portion of said wafer having the mark extends through the at least one slot; means for illuminating the mark on said wafer; and
    means for reflecting light from said wafer to the at least one gradation of the mark, reading area, wherein said means for reflecting light is coupled to the support structure.

2. The apparatus of claim 1, wherein the back support is a quadrilateral having a rectangular shape, the vertical support is a quadrilateral having a trapezoidal shape, and the wafer support is a quadrilateral having a rectangular shape, wherein the wafer support is positioned at an angle.

3. The apparatus of claim 2, wherein said at least one slot comprises a plurality of slots, each slot of said plurality of slots is spaced apart from an adjacent slot by at least a width of said wafer.

4. The apparatus of claim 1, wherein said mark is a scribe mark.

5. The apparatus of claim 1, wherein said means for illuminating comprises one of a light emitting diode or ambient light.

6. The apparatus of claim 1, wherein said means for reflecting light comprises a mirror material disposed on a surface of said wafer support.

7. The apparatus of claim 6, wherein said means for reflecting light comprises a mirror spaced apart from the mirror material.

8. The apparatus of claim 7, wherein said mirror is a concave mirror.

9. An apparatus for reading a scribe mark on a wafer, comprising:
    a structure comprising:
        first and second plates, said first plate vertically spaced apart from said second plate and said first plate having first and second major surfaces and at least one slot extending into said first plate from the first major surface, the at least one slot for accepting the wafer, wherein a portion of the wafer having the scribe mark extends through the at least one slot;
        a back support having a scribe mark reading area that has at least one gradation; and
        a first vertical support coupling a first portion of said first plate to a first portion of said second plate, wherein the first vertical support has a trapezoidal shape, and wherein the structure has no movable parts; and
    a reflective material formed on a portion of the second major surface of said first plate, the wherein the reflective material reflects light from the scribe mark to the at least one gradation.

10. The apparatus of claim 9, further including a second vertical support, wherein said second vertical support couples a second portion of said first plate to a second portion of said second plate.

11. The apparatus of claim 9, wherein said reflective material is a mirror material.

12. The apparatus of claim 9, further including a mirror optically coupled to said mirror material.

13. The apparatus of claim 12, wherein said mirror is a concave mirror.

14. The apparatus of claim 9, further including a light source for providing light to be reflected to said mirror material.

15. The apparatus of claim 9, wherein said light source is a diode.

16. A method for reading a mark on a semiconductor wafer, comprising:
    providing a support structure comprising:
        a back support having an upper side, a lower side, a first vertical support side, and a mark reading area, wherein the mark reading area has at least one gradation;
        a vertical support having first, second, and third sides, the first side coupled to the first vertical support side of the back support; and
        a wafer support having a first side coupled to the upper side of the back support and a second side coupled to the second side of the vertical support, the wafer support having first and second major surfaces and at least one slot extending into the wafer support from the first major surface, the at least one slot for receiving said wafer, wherein a portion of said wafer having the mark extends through the at least one slot;
        means for reflecting light from said wafer to the at least one gradation of the mark reading area, wherein the means for reflecting light is coupled to the support structure; and
    placing the semiconductor wafer having a scribe mark in the at least one slot;
    receiving light reflected from the scribe mark; and
    reflecting the light reflected from the scribe mark to the mark reading area.

17. The method of claim 16, further including providing a source of light, wherein the light illuminates the semiconductor wafer.

18. The method of claim 16, wherein reflecting the light includes rectifying an image within the light.

19. The method of claim 16, further including viewing the scribe marks on a plurality of wafers simultaneously.

20. The method of claim 16, further including using a camera to record images of the scribe marks.

* * * * *